(12) United States Patent
Kunemund

(10) Patent No.: US 7,545,933 B2
(45) Date of Patent: Jun. 9, 2009

(54) DECRYPTION CIRCUIT, ENCRYPTION CIRCUIT, LOGIC CELL, AND METHOD OF PERFORMING A DUAL-RAIL LOGIC OPERATION IN SINGLE-RAIL LOGIC ENVIRONMENT

(75) Inventor: Thomas Kunemund, Munich (DE)

(73) Assignee: Infineon Technologies AG (DE)

( * ) Notice: Subject to any disclaimer, the term of this patent is extended or adjusted under 35 U.S.C. 154(b) by 878 days.

(21) Appl. No.: 11/067,309

(22) Filed: Feb. 25, 2005

(65) Prior Publication Data
US 2005/0213757 A1 Sep. 29, 2005

(30) Foreign Application Priority Data
Feb. 25, 2004 (DE) ............. 10 2004 009 144

(51) Int. Cl.
*G06F 21/00* (2006.01)
(52) U.S. Cl. .................................. 380/44
(58) Field of Classification Search ........... 380/44
See application file for complete search history.

(56) References Cited

U.S. PATENT DOCUMENTS

2003/0053625 A1\* 3/2003 Bially et al. ............ 380/42
2003/0084336 A1 5/2003 Anderson et al.
2004/0223383 A1 11/2004 Kunemund
2005/0193052 A1 9/2005 Elbe et al.

FOREIGN PATENT DOCUMENTS

DE 102 44 738 B3 3/2004

OTHER PUBLICATIONS

Saputra et al, "Masking the Energy Behavior of DES Encryption", 2003.\*
Sokolov et al., "Improving the security of dual-rail circuits", Technical Report Series, http://www.staff.ncl.ac.uk/i.g.clark/async/tech-reports/NCL-EECE-MSD-TR-2004-101.pdf, pp. 1-24 (2006).
France Office Action dated Mar. 24, 2006.

\* cited by examiner

*Primary Examiner*—Andrew L Nalven
(74) *Attorney, Agent, or Firm*—Dickstein, Shapiro, LLP.

(57) ABSTRACT

A decryption circuit for generating a decrypted data signal and a complementary decrypted data signal from a key. In addition, a means for performing a linkage specification so as to generate the logic signal and the complementary logic signal from the decrypted data signal and the complementary decrypted data signal in accordance with the linkage specification. In addition, an encryption means for generating an encrypted logic signal from the key and from the logic signal.

14 Claims, 14 Drawing Sheets

DECRYPTION CIRCUIT, ENCRYPTION CIRCUIT, LOGIC CELL, AND METHOD OF PERFORMING A DUAL-RAIL LOGIC OPERATION IN SINGLE-RAIL LOGIC ENVIRONMENT

CROSS-REFERENCE TO RELATED APPLICATION

This application claims priority from German Patent Application No. 102004009144.7, which was filed on Feb. 25, 2004, and is incorporated herein by reference in its entirety.

BACKGROUND OF THE INVENTION

1. Field of the Invention

The present invention relates to a decryption circuit, an encryption circuit, a logic cell as well as a method of performing a dual-rail logic operation in a single-rail logic environment, and in particular to an implementation, in terms of circuit technology, of the decryption circuit and the encryption circuit as well as of the logic cell in an integrated circuit.

2. Description of Prior Art

Integrated circuits (ICs) are implemented by means of standard cells. A standard cell, also referred to as logic cell below, performs a specific logic function in this context. In security ICs, cryptographic algorithms are implemented in standard cells.

Typically, switching networks and switch mechanisms of an IC are implemented, in micro-electronical terms, such that each bit of a state stored in a register is physically represented by exactly one electrical node at a register output. Such an embodiment is referred to as "single-rail" circuit technology. In single-rail circuit technology, what applies to all nodes in a combinational switching network, between registers as well as for their inputs, is that generally exactly one electric node corresponds to a logical value of an in-between-states bit and/or its complement.

Switching networks and switch mechanisms for security-relevant applications, in particular, must be protected against attacks. Differential power analysis (DPA) is one of the most important methods of attacks on ICs for security applications. For this reason, DPA is also employed for evaluating a sensitivity of ICs toward specific attacks on confidential information, such as passwords or cryptographic keys. With DPA, current profiles measured by statistical methods or charge integrals of the IC, which are calculated across one or several clock cycles, are evaluated for a given program and/or a given algorithm. For a multitude of program implementations, conclusions are then drawn, from a correlation of systematic data variations and the respective charge integral, as to the information to be protected.

One possibility of at least substantially impeding attacks is to exchange, or transmit, data between sub-systems of the IC only in an encrypted form as far as possible. The cryptosystem which is best suited for this purpose because it is provably secure is so-called one time pad encryption. A plain text $m=(m_1, m_2, \ldots)$ encoded as a bit sequence is encrypted, in accordance with an XOR operation, or XOR linkage, into an encrypted text c with a key $k=(k_1, k_2, \ldots)$, e.g. $k=100110001011\ldots$, obtained from a true random sequence. The encrypted text c results from the operation, or linkage, $c=e(m, k)=(k_1 \text{ XOR } m_1, k_2 \text{ XOR } m_2, \ldots)$. This means that a bit $c_j$ of the encrypted text $c=e(m, k)$ results from the XOR operation $k_j \text{ XOR } m_j$ of the corresponding bits of key k and plain text m. $k_j \text{ XOR } c_j = m_j$ is true because of k XOR k=0 and 0 XOR k=k. A decryption of the encrypted text c to restore the plain text m is performed in accordance with the same bitwise XOR operation. For a one time pad cryptosystem it is important that each key sequence be used only once for encrypting and decrypting, since otherwise information about plain texts may be determined by statistical methods.

Unlike conventional single-rail logic, wherein each bit within a data path or signal path is represented physically by precisely one electric node k of a switching network or switch mechanism, with an implementation in a so-called dual-rail logic, each bit is represented by two nodes k and kq, this bit having a valid logical value if k corresponds to the true logical value b of this bit, and if kq corresponds to the negated value bn=not (b).

A desired invariance of the charge integrals is achieved in that a so-called precharge state is inserted between two states, respectively, with valid logical values (b, bn)=(1,0) or (0,1), for which precharge state both k and kq are charged to have the same electrical potential, i.e. adopt logically invalid values (1,1) or (0,0). Thus, for the precharge state (1,1), a state sequence may be as follows:

$(1,1) \rightarrow (0,1) \rightarrow (1,1) \rightarrow (1,0) \rightarrow (1,1) \rightarrow (1,0) \rightarrow (1,1) \rightarrow (0,1) \rightarrow \ldots$ For any such state sequence, the following is true: with any transition $(1,1) \rightarrow (b, bn)$, precisely one node is charge-reversed from 1 to 0, and for all $(b, bn) \rightarrow (1,1)$, precisely one node is charge-reversed from 0 to 1. This is true independently of a logically valid value b of the state bit in question. This applies analogously to state sequences having a precharge state of (0,0).

However, the consequence is that the charge integrals corresponding to these state sequences are independent of the sequence (b, bn) of the logically valid values if the only thing that is taken care of is for nodes k and kq to have the same electrical capacitances. The current profile of a data path thus implemented therefore does not depend on time-related variations of the data to be processed. It is thus DPA-resistant.

DPA-sensitive circuits are conventionally either implemented in dual-rail circuit technology or in single-rail circuit technology in combination with a one time pad encryption. Both forms have disadvantages regarding their implementations. Implementation of DPA-sensitive circuits as fully customized macro in dual-rail circuit technology requires high expenditure in terms of circuit architecture, circuit implementation, layout, functional verification, system integration as well as system testing. On the other hand, encrypted computing in single-rail circuit technology requires a very high expenditure in terms of circuitry, and thus in terms of area.

SUMMARY OF THE INVENTION

It is an object of the present invention to provide a decryption circuit, an encryption circuit, a logic cell, a method of performing a dual-rail logic operation in a single-rail logic environment, as well as a computer program which enables advantageous realization and secure implementation of logic functions.

In accordance with a first aspect, the invention provides a decryption circuit, having:

a receiver for receiving an encrypted data signal on a data input line;

a generator for generating a decrypted data signal from the encrypted data signal and a key, and for generating a complementary decrypted data signal; and an outputter for outputting the decrypted data signal on a first data line, and the complementary decrypted data signal on a second data line.

In accordance with a second aspect, the invention provides an encryption circuit, having:

a receiver for receiving a logic signal on a first logic line, and a complementary logic signal on a second logic line;

a generator for generating an encrypted logic signal from the logic signal and/or from the complementary logic signal and from a key; and an outputter for outputting an encrypted logic signal on a data output line.

In accordance with a third aspect, the invention provides a logic cell, having:

a decryption circuit, having:
a receiver for receiving an encrypted data signal on a data input line;
a generator for generating a decrypted data signal from the encrypted data signal and a key, and for generating a complementary decrypted data signal; and
an outputter for outputting the decrypted data signal on a first data line, and the complementary decrypted data signal on a second data line;

an encryption circuit, having:
a receiver for receiving a logic signal on a first logic line, and a complementary logic signal on a second logic line;
a generator for generating an encrypted logic signal from the logic signal and/or from the complementary logic signal and from a key; and
an outputter for outputting an encrypted logic signal on a data output line;

a performer for performing a linkage specification, which is connected to the decryption circuit via the first data line and the second data line, and is connected to the encryption circuit via the first logic signal line and the second logic signal line, the performer for performing a linkage specification being configured to generate the logic signal and the complementary logic signal in accordance with the linkage specification from the decrypted data signal and the complementary decrypted data signal.

In accordance with a fourth aspect, the invention provides a method of performing a dual-rail logic operation in a single-rail logic environment, the method including the steps of:
a) receiving an encrypted data signal;
b) generating and outputting a decrypted data signal and a complementary decrypted data signal from the encrypted data signal and a key;
c) generating a logic signal and a complementary logic signal in accordance with a linkage specification from the decrypted data signal and the complementary decrypted data signal;
d) generating an encrypted logic signal from the logic signal and the key;
e) outputting the encrypted logic signal.

In accordance with a fifth aspect, the invention provides a computer program having a program code for performing the method of performing a dual-rail logic operation in a single-rail logic environment, the method including the steps of:
a) receiving an encrypted data signal;
b) generating and outputting a decrypted data signal and a complementary decrypted data signal from the encrypted data signal and a key;
c) generating a logic signal and a complementary logic signal in accordance with a linkage specification from the decrypted data signal and the complementary decrypted data signal;
d) generating an encrypted logic signal from the logic signal and the key;
e) outputting the encrypted logic signal, when the computer program runs on a computer.

The present invention is based on the findings that logic circuits and, in particular, cryptographic algorithms may advantageously be implemented in integrated circuits if sub-functions are performed in encrypted single-rail circuit technology, and other sub-functions are performed in dual-rail circuit technology. Such a combined circuit architecture is resistant to DPA attacks.

In addition, semi-customized implementation of logic functions is possible with commercial EDA tools. The flow of development includes VHDL implementation, logic synthesis, place & route, STA, scan-path insertion and ATPG. The inventive approach enables a development of standard cells for DPA-resistant semi-customized implementation of security-relevant circuit functions in integrated circuits. Cryptographic algorithms, such as the DES and AES standards or proprietary solutions may readily be realized in standard cells since they generally require only a few gate cells for, typically, XOR, multiplexers or S boxes.

A further advantage of the inventive approach is a potential mixture of the described security-relevant standard cells with conventional standard cells both in the logical and physical senses, since this will make it more difficult for an attacker to locate cryptographically sensitive parts of an algorithm, and/or to allocate them for implementation in the layout.

In addition, the inventive approach enables proprietary supplementation, typically referred to as design ware, of existing standard cell libraries. Unlike inherent, fully customized macros, the inventive standard cells require low expenditure in terms of time and resources for a design of circuit architecture and implementation, the layout, the functional verification, a system integration as well as tests required. This particularly applies to proprietary solutions whose complexity is small compared with the known DES and AES standards.

The inventive method enables processing, in dual rail logic, of values which have been created in single-rail logic, and subsequently outputting them again as single-rail logic values.

BRIEF DESCRIPTION OF THE DRAWINGS

Preferred embodiments of the present invention will be explained below in more detail with reference to the figures below, wherein.

DESCRIPTION OF PREFERRED EMBODIMENTS

Figure 1:
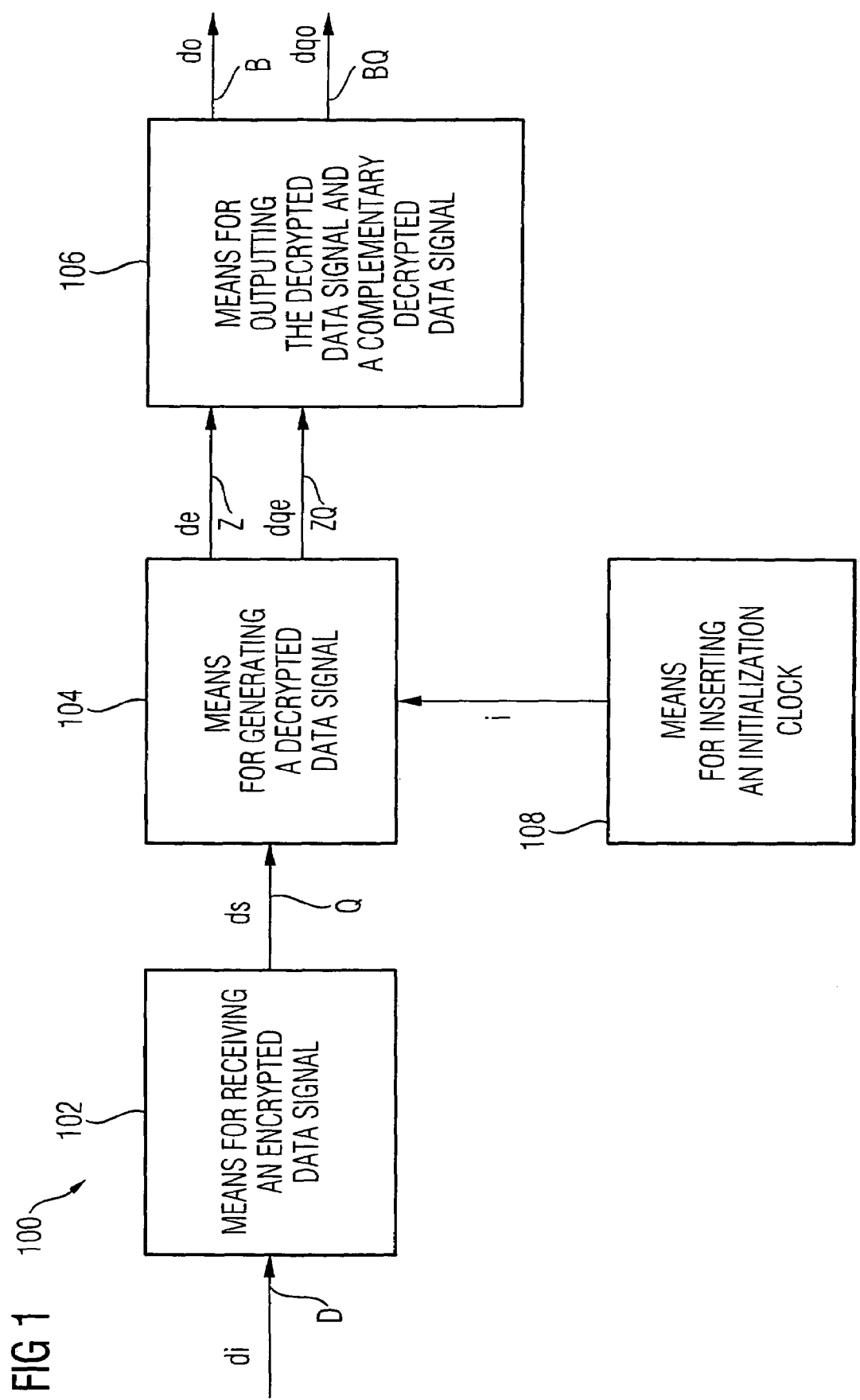
FIG. 1 is a diagrammatic representation of a decryption circuit in accordance with the present invention.

FIG. 1 shows a diagrammatic representation of an decryption circuit 100 in accordance with the present invention. The decryption circuit 100 comprises means 102 for receiving an encrypted data signal, means 104 for generating a decrypted data signal, and means 106 for storing and outputting the decrypted data signal and a complementary decrypted data signal.

In accordance with the present invention, the decryption circuit 100 is preferably employed as an input circuit of a logic cell subsequently shown in FIG. 11. The decryption circuit 100, however, may also be employed separately to convert an encrypted data signal di into a decrypted data signal do and a complementary decrypted data signal dqo.

Means 102 for receiving an encrypted data signal has a data input line D for receiving the encrypted data signal di. Means 102 for receiving an encrypted data signal is connected, via a first signal line Q, to means 104 for generating a decrypted data signal. A first signal ds, which corresponds to the encrypted data signal di, is transmitted via the first signal line Q. Preferably, the first signal ds is a clocked-in encrypted data signal di. Means 104 for generating a decrypted data signal is configured to decrypt the first signal ds and to provide a third signal de and a second complementary signal dqe complementary to the second signal de. Means 104 for generating a decrypted data signal is connected, via the second signal line Z and the second complementary signal line ZQ, to means 106 for outputting the decrypted data signal and a complementary decrypted data signal. The second signal de is transmitted via the second signal line Z, and the complementary second signal dqe is transmitted via the second complementary signal line ZQ. The second signal de corresponds to the decrypted data signal do, and the complementary second signal dqe corresponds to the complementary decrypted data signal dqo, which are output by/from means 106 for outputting the decrypted data signal, preferably in a clocked-out form, on a first data line B and a second data line BQ.

Information transmitted via the encrypted data signal di are encrypted with a key. For decrypting the encrypted data signal di, means 104 for generating a decrypted data signal comprises the key. The key may be supplied externally to means 104 for generating a decrypted data signal, or may be stored, as is the case in this embodiment, in means 104 for generating a decrypted data signal, and/or may be generated by a pseudo-random number generator. To enable continuous decryption of the encrypted data signal di, the encrypted data signal di is encrypted by a serial encryption method, a so-called one time pad. This enables serial processing of data received on the encrypted data signal di.

The decryption circuit shown in FIG. 1 is preferably employed in DPA-sensitive circuits. DPA-sensitive circuits are typically implemented in encrypted single-rail technology or dual-rail technology. The encrypted data signal di is implemented in the encrypted single-rail technology, and the decrypted data signal do as well as the complementary decrypted data signal dqo, in dual-rail technology. The decryption circuit 100 thus offers an interface between an encrypted single-rail technology environment and a dual-rail technology environment. If the decryption circuit 100 is employed as an input circuit of a logic cell, the decryption circuit enables a logic cell configured in dual-rail technology to be implemented in a circuit environment configured in encrypted single-rail technology.

To provide protection against DPA attacks, dual-rail signals typically have an initialization clock between any potential switching operation, during which the dual-rail signals are placed into an identical initialization state or precharge state. Since such an initialization clock does not exist in single-rail technology, it must be inserted into the inventive decryption circuit 100.

In accordance with a preferred embodiment, the decryption circuit 100 depicted in FIG. 1 comprises means 108 for inserting an initialization clock. Means 108 for inserting an initialization clock is configured to generate an initialization signal i. In response to the initialization signal i, means 104 for generating a decrypted data signal inserts an initialization clock on the second signal lines Z, ZQ. The result of the initialization clock is that during the initialization clock, a precharge state value is transmitted on lines Z and ZQ which is identical on both lines.

For clarity's sake, the decryption circuit 100 depicted in FIG. 1 is shown as 1-bit circuit. Typically, the decryption circuit 100 is configured as a multi-bit circuit. In a multi-bit implementation, the signal lines D, Q shown as well as the pairs of signal lines Z, ZQ and BBQ are replaced by signal line busses. In such a case, the key used in a means for generating a decrypted data signal has a bit width which corresponds to a bus width of an encrypted data signal.

For controlling the decryption circuit 100, the decryption circuit 100 either has means for controlling (not shown in FIG. 1), or it has inputs (not shown in FIG. 1) for receiving externally generated control signals.

Figure 2:
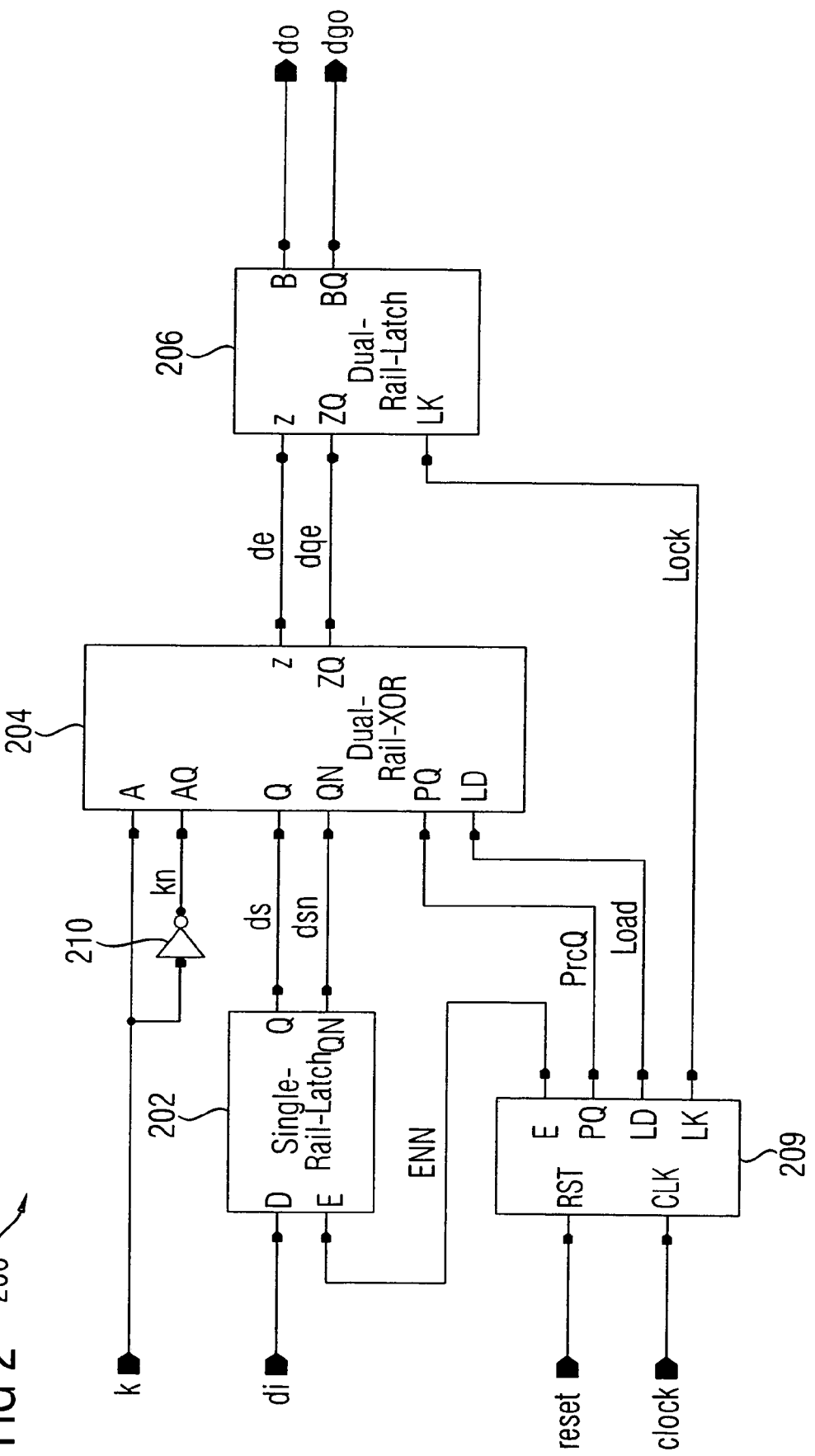
FIG. 2 shows a block diagram of a decryption circuit in accordance with a preferred embodiment of the present invention.

FIG. 2 shows a block diagram of a preferred embodiment of a decryption circuit 200. In accordance with the representation illustrated in FIG. 1, the decryption circuit 200 comprises means 202 for receiving an encrypted data signal, the means being depicted as a single-rail latch in FIG. 2, means 204 for generating a decrypted data signal, the means being depicted as a dual-rail XOR circuit in FIG. 2, means 206 for outputting the decrypted data signal and a complementary decrypted data signal, the means being depicted as a dual-rail latch in FIG. 2, as well as means 209 for controlling. Signals and signal lines which have already been explained with reference to FIG. 1 have the same reference numerals below and will not be described again so as to avoid repetition. The decryption circuit 200, in turn, is configured to receive the encrypted data signal di, to decrypt it and to output it as a decrypted data signal do and as a complementary decrypted data signal dqo.

In addition to the first signal line Q, means 202 for receiving an encrypted data signal is connected, via the first complementary signal line QN, to means 204 for generating a decrypted data signal. A first signal dsn which is complementary to the first signal ds is transmitted via the first complementary signal line QN. The first complementary signal dsn is generated from the encrypted data signal di in means 202 for receiving an encrypted data signal. Means 202 for receiving an encrypted data signal is further connected via a first control line E, via which a first control signal ENN is transmitted from means 209 for controlling to means 202 for receiving an encrypted data signal.

The decryption circuit 200 depicted in FIG. 2 is configured to receive externally generated key information. For this purpose, means 204 for generating a decrypted data signal comprises a key line A as well as a complementary key line AQ. Means 204 for generating a decrypted data signal receives a key signal k via key line A, and it receives a complementary key signal kn via the complementary key line AQ. The complementary key signal kn is generated from key signal k by means of an inverter 210. For this purpose, the inverter 210 is connected to key line A. Key signal k, which is received via key line A, is used to decrypt the encrypted data signal di. Means 204 for generating a decrypted data signal further comprises a second control line PQ as well as a third control line LD. Means 204 for generating a decrypted data signal is connected to means 209 for controlling via the second control line PQ as well as the third control line LD. Via the second control line PQ, a second control signal PrcQ, and via the third control line LD, a third control signal "Load" are transmitted from means 209 for controlling to means 204 for generating a decrypted data signal.

Means 206 for outputting the decrypted data signal and a complementary decrypted data signal comprises, in addition to the embodiment shown in FIG. 1, a fourth control line LK, via which means 206 for outputting the decrypted data signal is connected to means 209. Via the fourth control line LK, a fourth control signal "Lock", generated by means 209 for controlling, is transmitted from means 209 for controlling to means 206 for outputting the decrypted data signal.

Means 209 for controlling generates the control signals ENN, PrcQ, Load, Lock from a reset signal "reset" as well as a clock signal "clock". The reset signal and the clock signal are supplied to the decryption circuit 200 from outside. For this purpose, means 209 for controlling comprises a reset line RST for receiving the reset signal as well as a clock line CLK for receiving the clock signal.

The decryption circuit 200, depicted in FIG. 2, represents a one-bit realization of an inventive decryption circuit. The function of the decryption circuit 200 depicted in FIG. 2 will be explained by means of a time-related behavior of the input and output signals described as well as of the inner-circuit signals described, with reference to FIG. 2a.

Via the reset signal, a clear starting condition of the decryption circuit 200 is established. After such an initialization, the reset signal has no importance for the actual function of the decryption circuit 200. This is why the effect of the reset signal will not be explained in more detail below. In the time diagram shown in FIG. 2a, the initialization has already been completed, and the reset signal is constantly at 0. The states 0 and 1, depicted in FIG. 2a, correspond to logic circuit states. At a first time $t_1$, the clock signal has a rising edge, and at a second time $t_2$, it has a falling edge. The times $t_1$, $t_2$ are plotted on a horizontal time axis "time".

In means 209 for controlling, a falling edge of the fourth control signal Lock is initially derived, in a first follow-up state 202', from the rising edge of the clock signal at a first time $t_1$. Thereby, a feedback in means 206 for outputting the decrypted data signal is turned off. Means 206 for outputting the decrypted data signal will be described in more detail in FIG. 5. In a second follow-up state 204', a falling edge of the second control signal PrcQ as well as a rising edge of the first control signal ENN are generated in means 209 for controlling. In response to the falling edge of the second control signal PrcQ, means 204 for generating a decrypted data signal places the second signal line Z as well as the second complementary signal line ZQ into a precharge state (1,1). This precharge state corresponds to the precharge in dual-rail technology. In response to the rising edge of the first control signal ENN, means 202 for receiving an encrypted data signal is configured to interrupt a conductive connection of data input line D with the first signal line Q and the first complementary signal line QN. As a consequence hereof, the encrypted data signal di on the data input line D may change without influencing the values, held on the first signal line Q and the first complementary signal line QN, of the first signal ds as well as of the first complementary signal dsn. A detailed description of means 202 for receiving an encrypted data signal will be given below with reference to FIG. 3, a detailed description of means 204 for generating a decrypted data signal will be given with reference to FIG. 4, and a more detailed description of means 209 for controlling will be given with reference to FIG. 6.

Figure 2A:
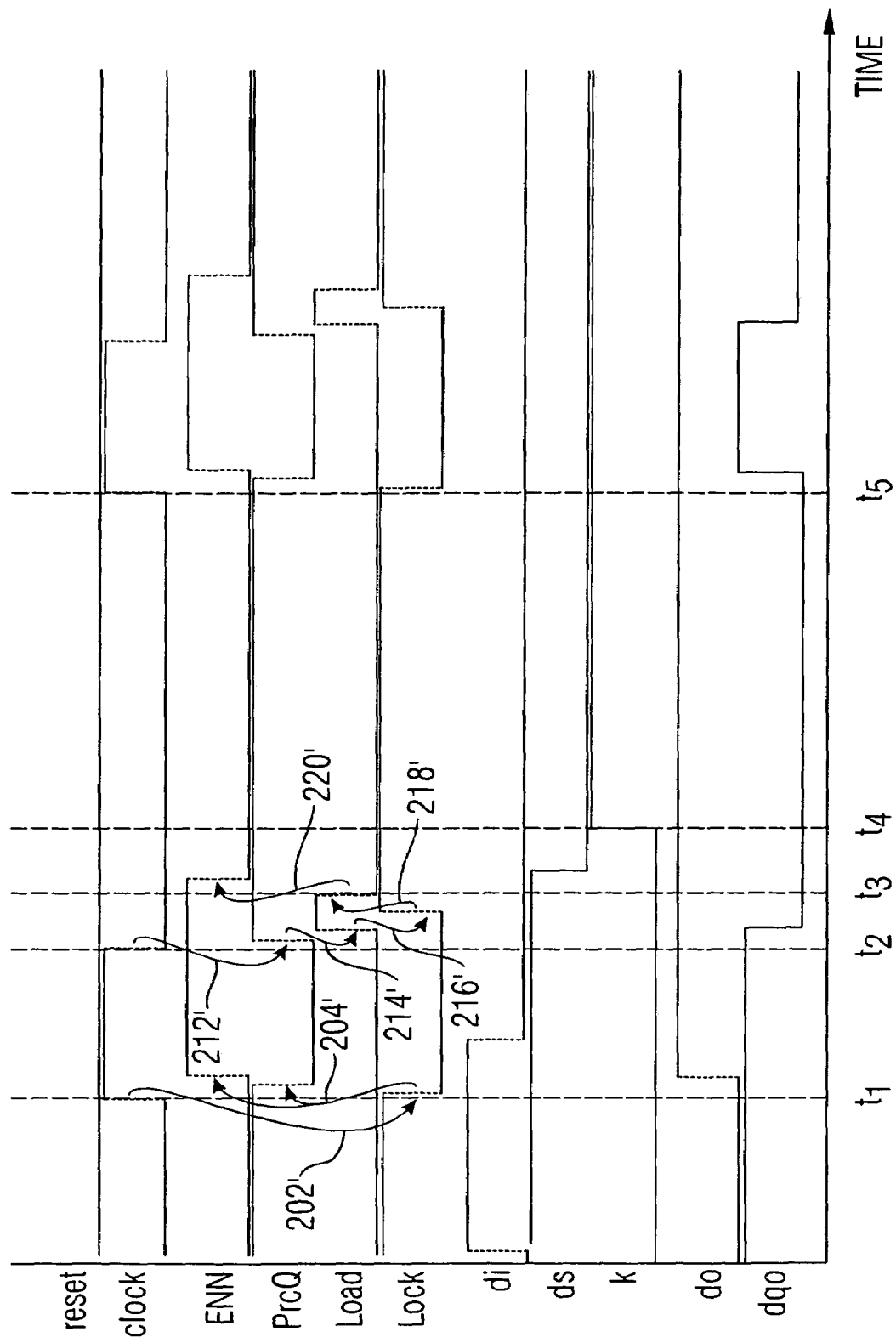
FIG. 2a is a signal diagram of signals of the decryption circuit shown in FIG. 2.

From the next falling edge of the clock signal at the second time $t_2$, a rising edge of the second control signal PrcQ is derived in means 209 for controlling. This is shown in FIG. 2a by means of a third follow-up state 212'. The rising edge of the second control signal PrcQ results, in means 204 for generating a decrypted data signal, in the precharge operation of the second signal lines Z, ZQ to be switched off. In a third follow-up state 214', a rising edge of the third control signal Load is provided by means 209 for controlling. In response to the rising edge of the third control signal Load, a decryption logic (depicted in FIG. 4) is activated in means 204 for generating a decrypted data signal, so that the second signal lines Z, ZN adopt valid logical values corresponding to the decrypted values of the first signal ds as well as of the first complementary signal dsn. The first signals ds, dsn are decrypted using the key provided via key signal k. In a fourth follow-up state 214', means 209 for controlling provides a rising edge of the fourth control signal Lock. In response to the rising edge of the fourth control signal Lock, a feedback is switched on in means 206 for outputting the decrypted data signal. The feedback results in that the decrypted data signals do, dqo, which are output on the first data line B as well as on the second data line BQ, are held. In a fifth follow-up state 216', means 209 for controlling provides a falling edge of the third control signal Load. An inactive third control signal Load, which is in the state of a logical 0 and which is designated by the state of 0 in FIG. 2a, results in that the signals k, kn, ds, dsn on means 204 for generating a decrypted data signal may change without influencing the values output on the second signal lines Z, ZQ. In a seventh follow-up state 220', means 209 for controlling provides the first control signal ENN with a value set to 0. In response to the value, set to 0, of the first control signal ENN, means 202 for receiving an encrypted data signal is switched to be transparent, i.e. the data input line D is again conductively connected to the first signal lines Q, QN.

What is decisive for a correct functioning of the decryption circuit 200 is that the key signal k does not change until after a falling edge of the third control signal Load. FIG. 2 depicts the falling edge of the third control signal Load at the third time $t_3$, and the change in the key signal k at the fourth time $t_4$. If a key bit transmitted on key line A changed prior to the third time $t_3$, a date, stored on the first signal lines ds, dsn and encrypted, as required, with the key bit transmitted by key signal k, would be decrypted with a wrong key bit. Therefore, care must be taken, externally to the inventive decryption circuit, that key signal k, in this embodiment a one time pad key (OTP key), is generated such that a hold time, which is dependent on an implementation of the inventive decryption circuit and is to be determined by a characterization, with regard to a falling edge of the clock signal is adhered to. This may very readily be achieved by central clocking of the key signal k by means of suitable registers (not shown) and/or a clock tree synthesis.

Figure 3:
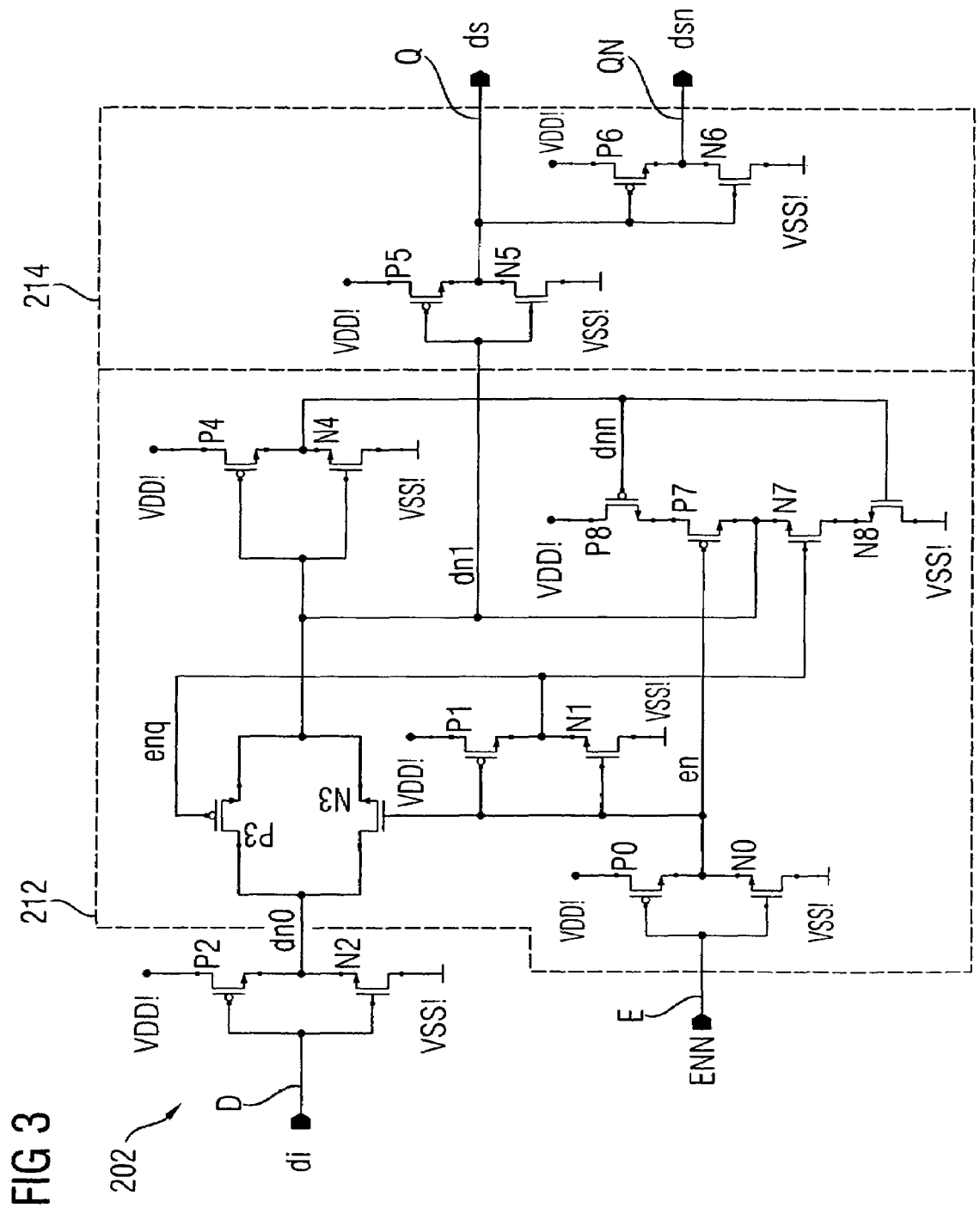
FIG. 3 is a circuit diagram of a means for receiving an encrypted data signal in accordance with a preferred embodiment of the present invention.

FIG. 3 shows a circuit diagram of means 202, shown in FIG. 2, for receiving an encrypted data signal in transistor logic. Means 202 for receiving an encrypted data signal comprises, as is described in FIG. 2, a data input line D for receiving an encrypted data signal di, as well as a first control line E for receiving a first control signal ENN. In addition, means 202 for receiving an encrypted data signal comprises a first signal line Q for outputting a first signal ds, as well as a first complementary signal line QN for outputting a first complementary signal dsn.

As is depicted in FIG. 3, an inverter circuit, which consists of transistors P2, N2, generates an inverted, encrypted data signal dn0 from the encrypted data signal di. In this embodiment and in those which follow, transistors referred to by P are conductive at a value of a logical 0 applied at a control terminal (gate in MOS technology, gate in bipolar technology). In this embodiment and those which follow, transistors referred to by N are conductive at a value of a logical 1 applied at the control terminal.

The inverted encrypted data signal dn0 is read in by a single-rail input circuit 212. The single-rail input circuit 212 comprises the transistors N0, N1, N3, N4, N7, N8, P0, P1, P3, P4, P7, P8 and generates a data signal dn1, which has been read in. The data signal dn1 read-in is read in by a dual-rail output circuit 214. The dual-rail output circuit 214 comprises transistors N5, N6, P5, P6 and generates the first signals ds, dsn.

The single-rail input circuit 212 will be described below. An inverter circuit, consisting of transistors P0, N0, generates an inverted first control signal en from the first control signal ENN. The inverted first control signal en is converted into the complementary first control signal enq in a further inverter circuit, consisting of transistors P1, N1. A read-in circuit, consisting of transistors P3, N3, is controlled by the inverted first control signal en as well as the complementary first control signal enq. The inverted encrypted data signal dn0 is connected through to a data signal dn1 read-in if the first control signal ENN is inactive, i.e., as is shown in FIG. 2a, has the value of a logical 0. If the first control signal ENN is active, i.e. if it has the value of a logical 1, the inverted encrypted data signal dn0 is not connected through to the data signal dn1 read-in, but the data signal dn1 read-in is held. For this purpose, the decryption circuit 202 comprises a further inverter means, consisting of transistors P4, N4, which circuit generates, from the data signal dn1 read-in, an inverted data signal dnn read-in as well as a second inverter circuit, consisting of transistors P8, N8, which, controlled by transistors P7, N7, where the inverted first control signal en as well as the complementary first control signal enq are applied, feeds back the data signal dn1 read-in from the inverted data signal dnn read-in. The transistors P7, N7 thus enable a feedback of the inverted data signal dnn read-in onto the data signal dn1 read-in, if the first control signal ENN is active, and if the inverted encrypted data signal dn0 is thus not connected through to the data signal dn1 read-in.

The dual-rail output circuit 214 will be described below. An inverter circuit, consisting of transistors P5, N5, generates the first signal ds on the first signal line from the data signal dn1 read-in. A further inverter circuit, consisting of transistors P6, N6, generates the first complementary signal dsn from the first signal ds.

As may be seen in FIG. 3, the inverter circuits mentioned are arranged between an operating voltage potential VDD! as well as a ground potential VSS!. As an alternative to the operating voltage connections VDD! shown as well as to the ground connections VSS! shown, further circuits (not shown) may be depicted in FIG. 3 as well as in the subsequent drawings, such further circuits providing an appropriate potential.

Figure 4:
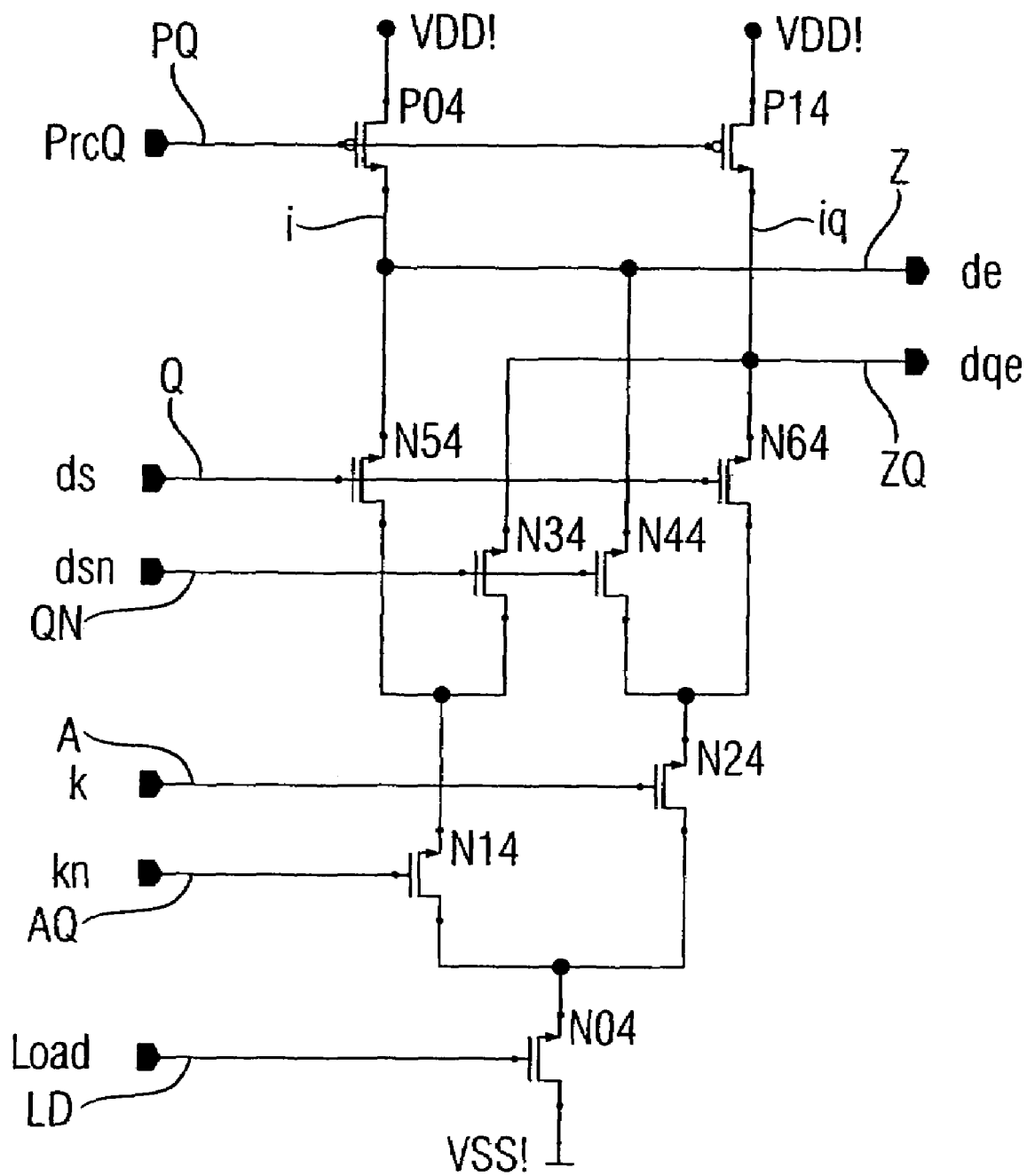
FIG. 4 is a circuit diagram of a means for generating a decrypted data signal in accordance with a preferred embodiment of the present invention.

FIG. 4 shows a preferred embodiment of means 204 for generating a decrypted data signal in transistor logic. As is shown in FIG. 2, means 204 for generating a decrypted data signal comprises a first signal line Q for receiving a first signal ds, as well as a first complementary signal line QN for receiving a first complementary signal dsn, as well as a key line A for receiving a key signal k, and a complementary key line AQ for receiving a complementary key signal kn. In addition, means 204 for generating a decrypted data signal comprises a second control signal line PQ for receiving a second control signal PrcQ, as well as a third control line LD for receiving a third control signal Load. In addition, means 204 for generating a decrypted data signal comprises a second signal line Z for outputting a second signal de as well as a complementary second signal line ZQ for outputting a second complementary signal dqe.

Means 204 for generating a decrypted data signal comprises means for inserting an initialization clock, consisting of transistors P04, P14. The second control signal PrcQ is connected to the control terminal, referred to below as gate, of transistors P04, P14, respectively. The sources of transistors P04, P14 are connected to the operating voltage potential VDD. As is depicted in FIG. 4, the drain terminal of transistor P04 is connected to the second signal line Z via a complementary initialization line i, and the drain terminal of transistor P14 is connected to the second complementary signal line ZQ via the initialization line iq. By means of transistors P04, P14, the second signal lines Z, ZQ are precharged to a precharge value (1,1) in according with dual-rail technology. As is depicted in FIG. 2a, the precharging operation is controlled via the second control signal PrcQ. An active second control signal PrcQ results in the second signal line Z, ZQ to be precharged. An inactive second control signal PrcQ deactivates transistors P04, P14. As is depicted in FIG. 2a, the third control signal Load is set to an active value subsequently to a rising edge of the second control signal PrcQ. The third control signal Load is connected to the gate of a transistor N04 via a third control signal line LD.

An active third control signal Load causes the transistor N04, the source of which is connected to the ground potential VSS, to be connected through. The third control signal Load thus activates, via transistor N04, an XOR circuit consisting of transistors N14, N24, N34, N44, N54, N64. The XOR circuit is connected, on its input side, to the first signals ds, dsn and the key signals k, kn and, on the output side, to the second signals de, dqe. The second data signals de, dqe are an XOR operation of the first signals ds, dsn, corresponding to the encrypted data signal, and of the key signals k, kn. Thus, the decryption of the encrypted data signal di (depicted in FIG. 3) is effected via a bitwise XOR operation with the key signal k.

The architecture of the XOR circuit, consisting of transistors N14, N24, N34, N44, N54, N64, will be described below. The first signal ds is connected to the gate of transistor N54 as well as the gate of transistor N64. The drain of transistor N54 is connected to the second signal de, and the drain of transistor N64 is connected to the second complementary signal dqe. The first complementary signal dsn is connected to the gate of transistor N34 and to the gate of transistor N44. The drain of transistor N34 is connected to the second complementary signal dqe, and the drain of transistor N44 is connected to the second signal de. The key signal k is connected to the gate of transistor N24, and the complementary key signal kn is connected to the gate of transistor N14. The source terminals of transistors N14, N24 are connected to the drain of transistor N04. The drain of transistor N14 is connected to the source terminals of transistors N34, N54, and the drain of transistor N24 is connected to the source terminals of transistors N44, N64.

Figure 5:
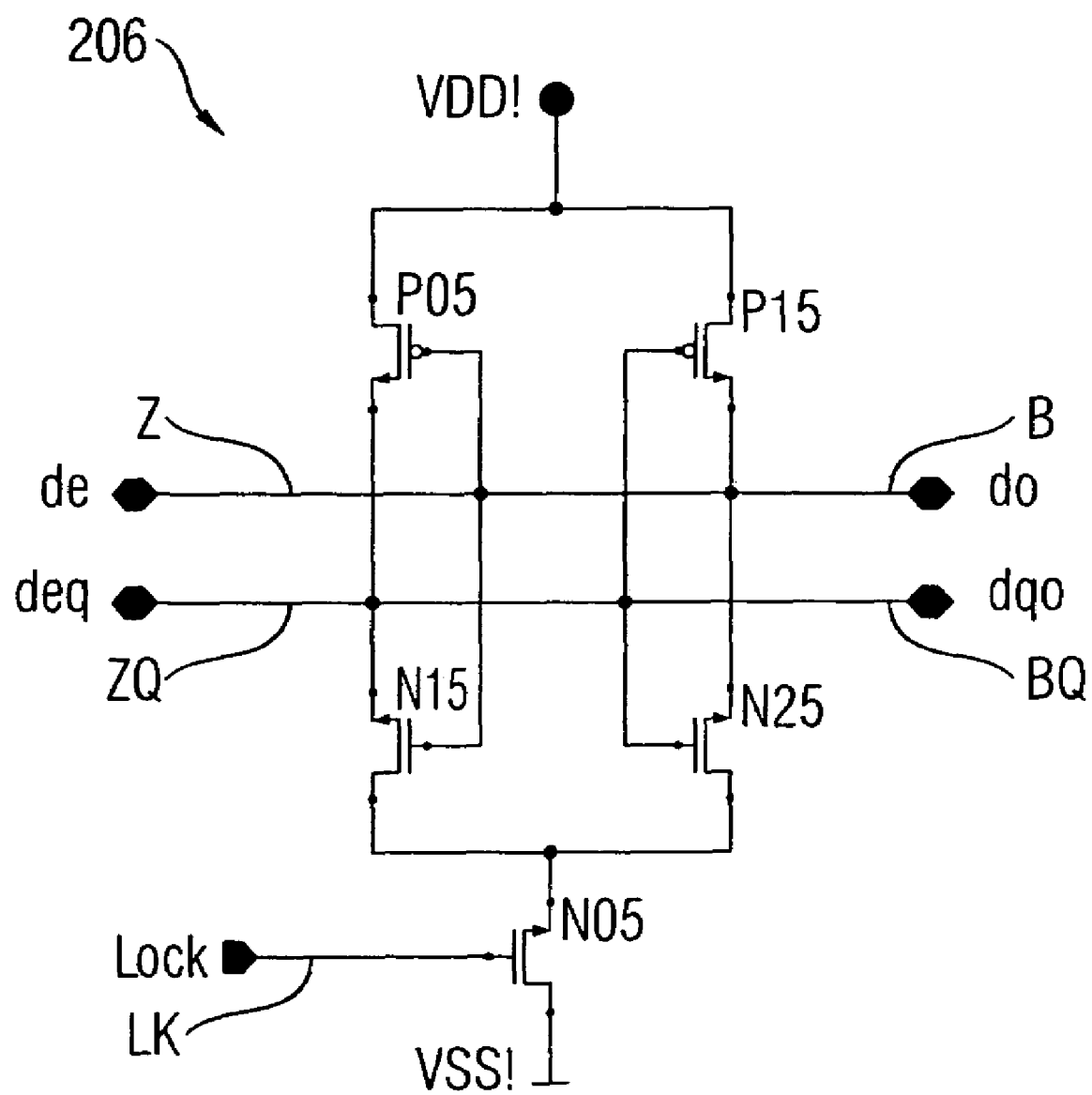
FIG. 5 shows a circuit diagram of a means for storing and outputting the decrypted data signal in accordance with a preferred embodiment of the present invention.

FIG. 5 shows a circuit diagram of a preferred embodiment of the means 206, depicted in FIG. 2, for storing and outputting the decrypted data signal in transistor logic.

As is shown in FIG. 2, means 206 for outputting the decrypted data signal comprises a second signal line Z for receiving a second signal de, as well as a second complementary signal line ZQ for receiving a second complementary signal deq, and a fourth control line LK for receiving a fourth control signal Lock, as well as a first data line B for outputting a decrypted data signal do, as well as a second data line BQ for outputting a complementary decrypted data signal dqo.

As is depicted in FIG. 5, means 206 for outputting the decrypted data signal comprises four transistors P05, P15, N15, N25 forming a dual-rail latch, as well as a transistor N05 for activating the latch. The fourth control signal line LK is connected to the gate of the transistor N05. As is shown in FIG. 2a, an active fourth control signal Lock causes a feedback of the second signals de, dqe to be switched on to the decrypted data signals do, dqo. For this purpose, the second signal de is connected to the gate of transistor P05, the drain of transistor P15, the drain of transistor N25 as well as the gate of transistor N15. The complementary second signal deq is connected to the drain of transistors P05, N15 as well as to the gate of transistors P15, N25. The sources of transistors P05, P15 are connected to the operating voltage potential VDD!, and the sources of transistors N15, N25 are connected to the drain of transistor N05, the source of which lies at the ground potential VSS!. For clarity's sake, the second signal line Z and the first data line B, as well as the second complementary signal line ZQ and the second data line BQ are represented as separate lines, respectively. Since lines Z, B as well as lines ZQ, BQ are connected as depicted in FIG. 5, the second signal lines Z, ZQ for the means 206 for outputting the encrypted data signal may act both as input lines and as output lines.

Figure 6:
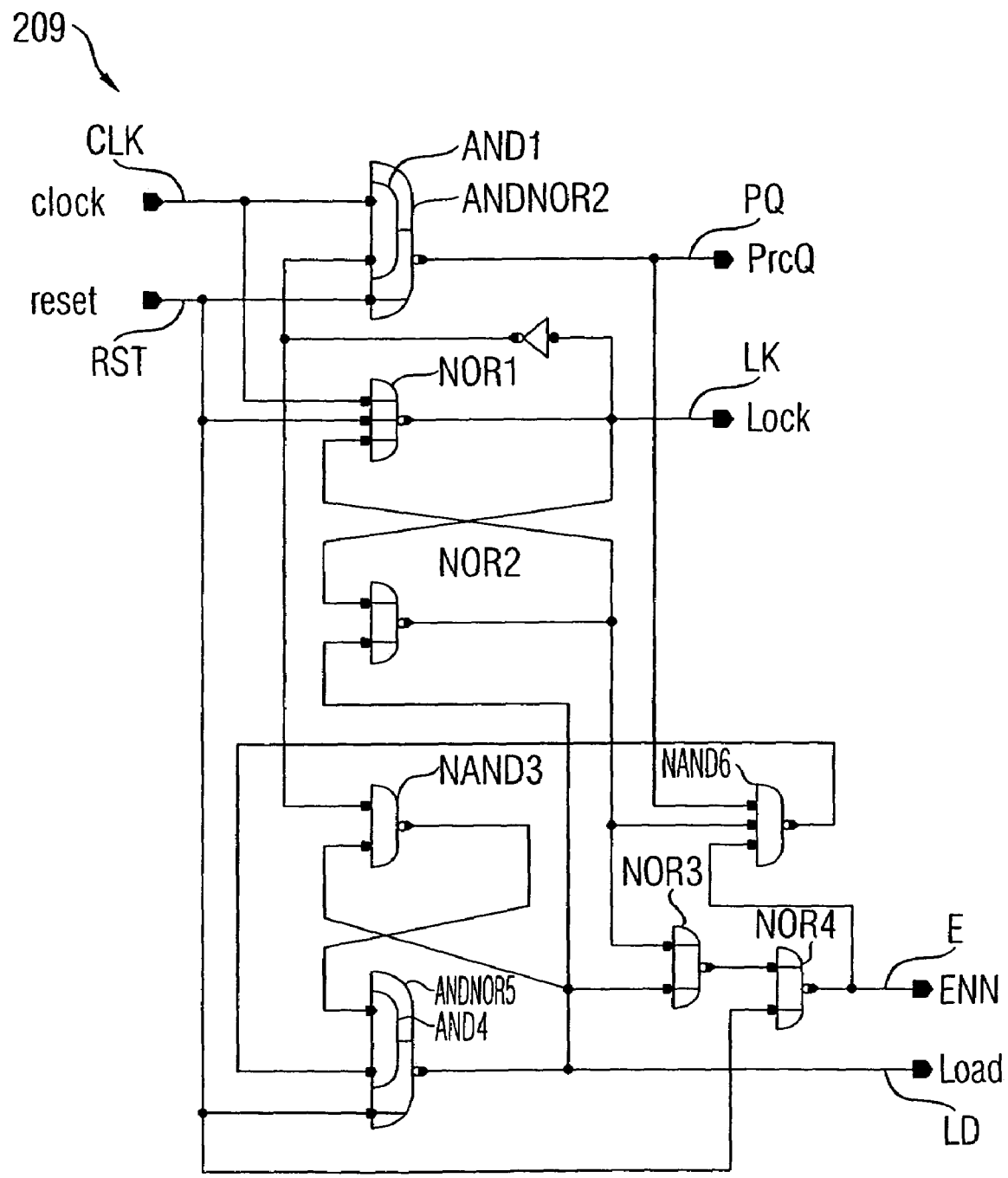
FIG. 6 is a circuit diagram of a means for controlling in accordance with a preferred embodiment of the present invention.

FIG. 6 shows a circuit diagram of a preferred embodiment of means 209 for controlling, depicted in FIG. 2. As is shown in FIG. 2, means 209 for controlling comprises a clock line CLK for receiving a clock signal, as well as a reset line RST for receiving a reset signal. Means 209 for controlling is configured to generate control signals. For this purpose, means 209 for controlling comprises a first control line E for outputting a first control signal ENN, a second control line PQ for outputting a second control signal PrcQ, a third control line LD for outputting a third control signal Load, as well as a fourth control line LK for outputting a fourth control signal Lock. As may be seen from FIG. 6, means 209 for controlling comprises a plurality of NAND gates and NOR gates as well as OR circuits.

Reset line RST is connected, on the input side, to an OR circuit ANDNOR2, a NOR gate NOR1, an OR circuit ANDNOR5 as well as a NOR gate NOR4. The clock line CLK is connected, on the input side, to an AND gate AND1 as well as the NOR gate NOR1 (AND1 is a logical part of ANDNOR2). The output signal of the OR circuit ANDNOR2 is connected to the second control line PQ. The second control line PQ is additionally connected, on the input side, to a NAND gate NAND6. The fourth control line LK is connected to the output of the NOR gate NOR1, is connected, via an inverter, on the input side, to the AND gate AND1 and, on the input side, to a NOR gate NOR2. The output signal of the NOR gate NOR2 is connected, on the input side, to the NOR gate NOR1 as well as to the NAND gate NAND6 as well as to a NOR gate NOR3. The fourth control signal Lock is additionally connected, on the input side, in an inverted form, to a NAND gate NAND3. The output signal of the NAND gate NAND3 is connected, on the input side, to the AND gate AND4 (AND4 is a logical part of ANDNOR5). The inverted output signal of the OR circuit ANDNOR5 is the third control signal Load. The third control signal Load is connected, on the input side, to the NOR gate NOR3, the NAND gate NAND3 as well as the NOR gate NOR2. The output signal of the NAND gate NAND6 is connected, on the input side, to the OR circuit ANDNOR5. The output signal of the NOR gate NOR3 is connected, on the input side, to the NOR gate NOR4. The output signal of the NOR gate NOR4 is connected, on the input side, to the NAND gate NAND6 and at the same time represents the first control signal E.

Figure 7:
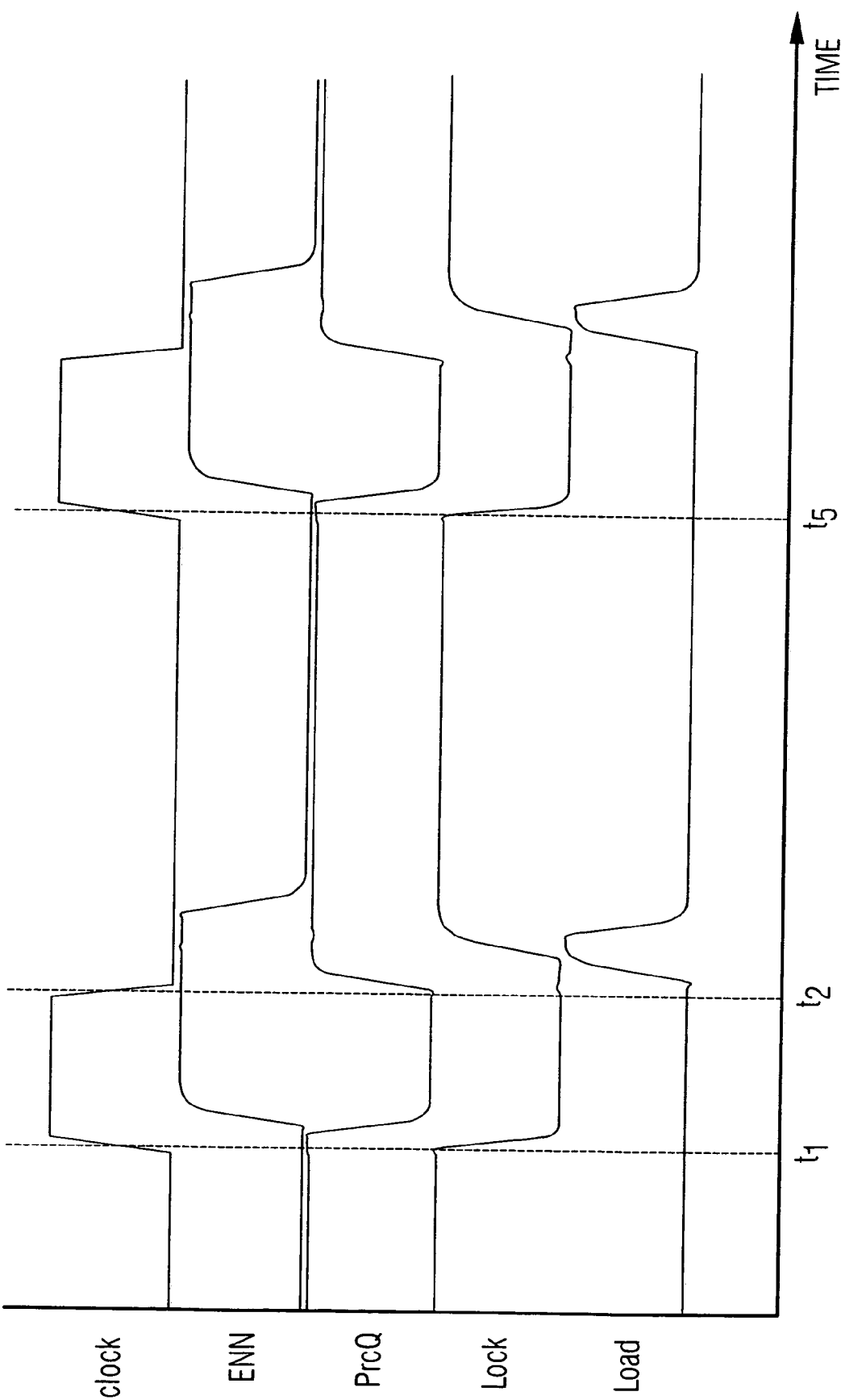
FIG. 7 is a signal diagram of signals of the means for controlling in accordance with FIG. 6.

FIG. 7 shows a time-related behavior of the control signals ENN, PrcQ, lock, Load, depicted in FIG. 6. As is already depicted in FIG. 2a, a rising edge of the clock signal at a first time $t_1$ is followed by a falling edge of the fourth control signal Lock and, subsequently, by a falling edge of the second control signal PrcQ as well as by a rising edge of the first control signal ENN. A falling edge of the clock signal at a second time $t_2$ is followed by a rising edge of the second control signal PrcQ, by a rising edge of the third control signal Load, a rising edge of the fourth control signal Lock as well as by, subsequently, a falling edge of the third control signal Load and a falling edge of the first control signal ENN. The processes described above repeat themselves with a subsequent rising edge of the clock signal at a time $t_5$.

Figure 8:
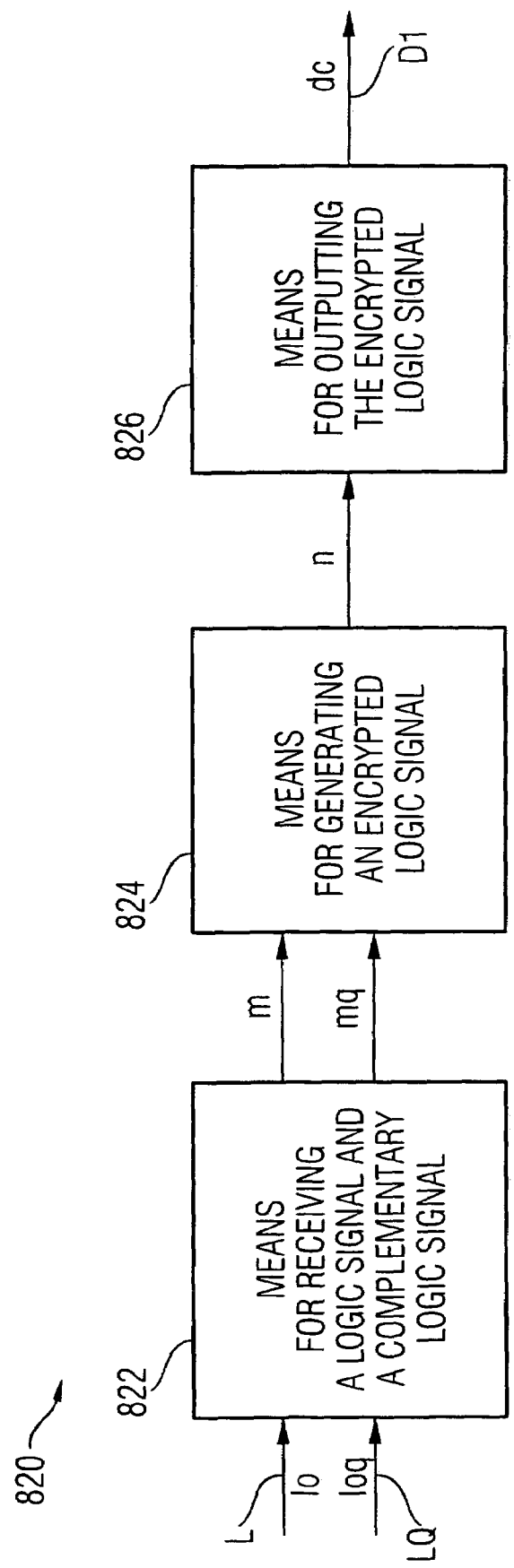
FIG. 8 is a block diagram of an encryption circuit in accordance with the present invention.

FIG. 8 shows a diagrammatic representation of an encryption circuit 820 in accordance with the present invention. The encryption circuit 820 may be employed as an autonomous circuit for converting a logic signal lo and a complementary logic signal loq into an encrypted logic signal by means of a key, but is preferably employed as an output circuit of a logic cell. Such a logic cell will be described below with reference to FIG. 11.

The encryption circuit 820, depicted in FIG. 8, comprises means 822 for receiving a logic signal and a complementary logic signal, means 824 for generating an encrypted logic signal, and means 826 for outputting the encrypted logic signal. Means 822 for receiving a logic signal comprises a first logic line L for receiving a logic signal lo, as well as a second logic line LQ for receiving a logic signal loq complementary to the logic signal lo. Means 822 for receiving a logic signal is connected to means 824 for generating an encrypted logic signal and is configured to provide means 824 for generating an encrypted logic signal with a decrypted logic signal m, which corresponds to logic signal lo, as well as a with decrypted complementary logic signal mq, which corresponds to the complementary logic signal loq. Means 824 for generating an encrypted logic signal is connected to means 826 for outputting the encrypted logic signal and is configured to provide means 826 for outputting the encrypted logic signal with an encrypted signal. Means 826 for outputting the encrypted logic signal comprises a data output line D1 for outputting an encrypted logic signal dc, which corresponds to the encrypted signal n. Means 824 for generating an encrypted logic signal is configured to generate the encrypted signal n from the decrypted logic signal m and from a key. The key, in turn, may be stored in means 824 for generating an encrypted logic signal, be generated within same or may be supplied to means 824 for generating an encrypted logic signal from outside.

With means 822 for receiving a logic signal, the encryption circuit 820 comprises a dual-rail technology interface. The logic signals lo, loq are preferably implemented in dual-rail technology with precharge states. In addition, the encryption circuit 820 comprises, with means 826 for outputting the encrypted logic signal, a single-rail interface. The encryption circuit 820 thus enables a transition between a circuit component implemented in dual-rail technology and a circuit component implemented in single-rail technology, the circuit component implemented in single-rail technology preferably being implemented with additional encryption.

Figure 9:
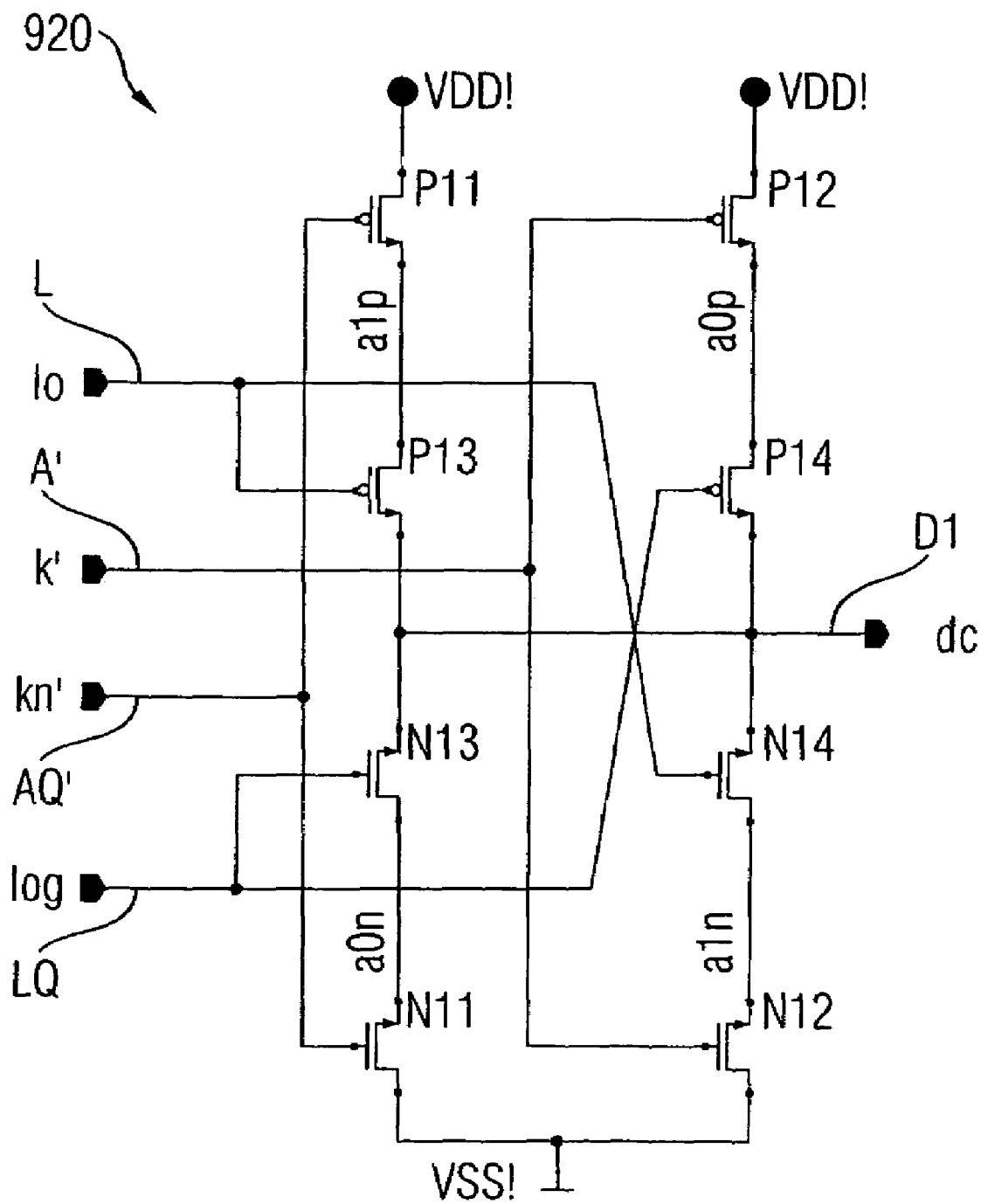
FIG. 9 is a detailed circuit diagram of an implementation of an encryption circuit in accordance with a preferred embodiment of the present invention.

FIG. 9 shows a circuit diagram of a preferred embodiment of an encryption circuit 920 in transistor logic. In addition to the first logic line L, already explained in FIG. 8, for receiving a logic signal lo, a second logic line LQ for receiving a complementary logic signal loq, and a data output line D1 for receiving an encrypted logic signal dc, the encryption circuit 920 depicted in FIG. 9 additionally comprises a key line A' for receiving a key signal k', and a complementary key line AQ' for receiving a complementary key signal kn'. In accordance with a preferred embodiment, the key signal k' is identical with the key signal k described in FIG. 2.

As is shown in FIG. 9, the encryption circuit 920 comprises eight transistors P11, P12, P13, p14, N11, N12, N13, N14. The first logic line L is connected to the gate terminals of transistors P13, N14, and the complementary logic line LQ is connected to the gate terminals of transistors N13, P14. The key line A' is connected to the gate terminals of transistors P12, N12, and the complementary key line AQ' is connected to the gate terminals of transistors P11, N11. The source terminals of transistors P11, P12 are connected to an operating voltage potential VDD!, and the source terminals of transistors N11, N12 are connected to a ground potential VSS!. The drain terminals of transistors P11, P12 are connected to the source terminals of transistors P13, P14, and the drain terminals of transistors N11, N12 are connected to the source terminals of transistors N13, N14. The drain terminals of transistors P13, P14, N13, N14 are connected to the data output line D1.

The encrypted logic signal dc thus results from an XOR operation of the logic signals lo, loq and the key signals k', kn'. Preferably, the encryption operation is implemented in dual-rail technology, and for this purpose, the logic signal lo and the complementary logic signal loq, as well as the key signal k' and the complementary key signal kn' are used. Alternatively, however, it is also possible to use only one of the respective signals.

Figure 10:
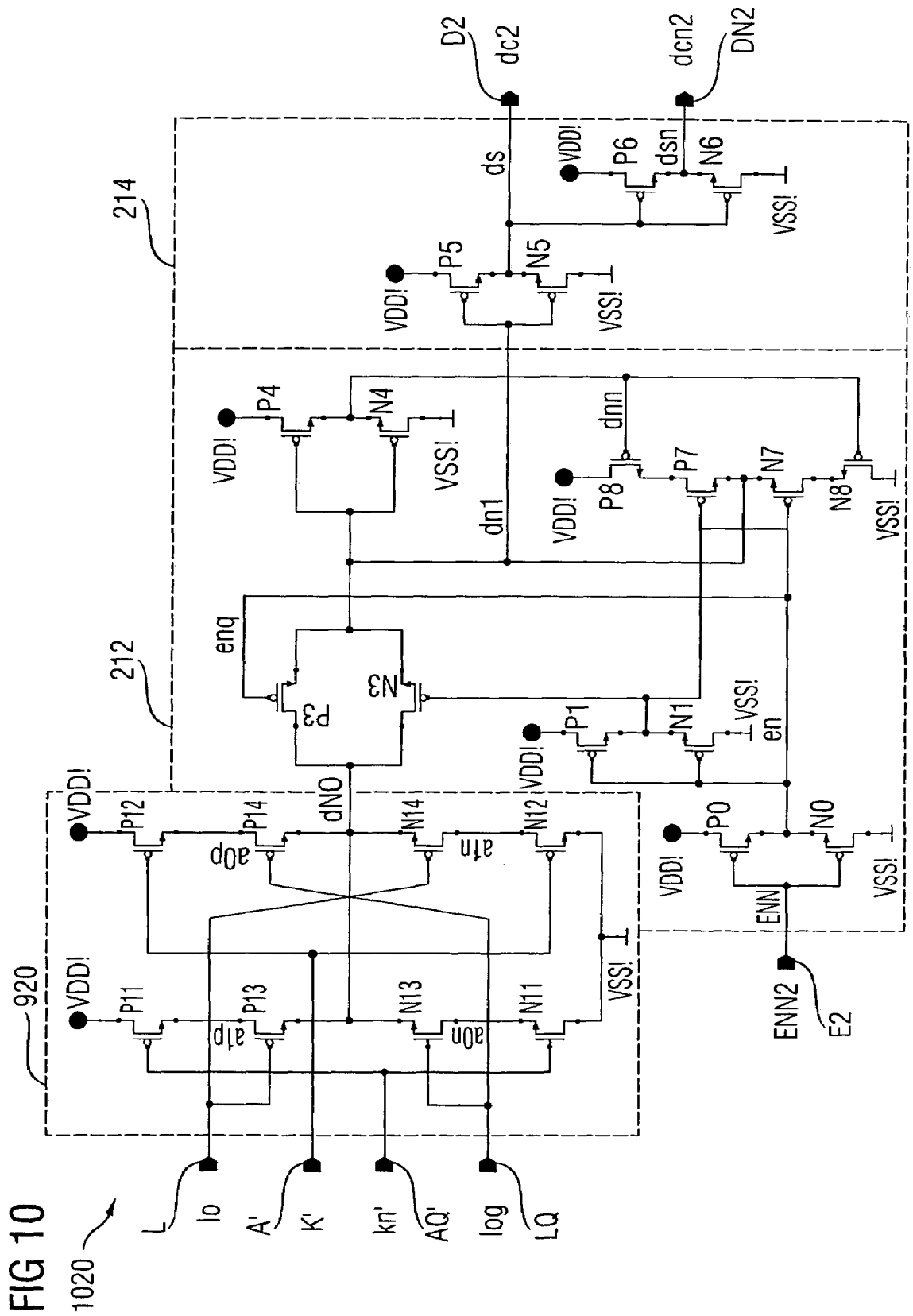
FIG. 10 is a circuit diagram of an encryption circuit in accordance with an alternative embodiment of the present invention.

FIG. 10 shows a further preferred embodiment of an encryption circuit 1020 in transistor logic. In addition to the logic lines L, LQ, described in FIG. 9 already, as well as key lines A', AQ' and the associated signals, encryption circuit 1020 comprises a data output line D2 for outputting an encrypted logic signal dc2, as well as a complementary data output line DN2 for outputting a complementary encrypted logic signal dcn2. In addition to the encrypted logic signal dc2, the encryption circuit 1020 additionally provides, in accordance with the embodiment described in FIG. 10, a complementary encrypted logic signal dcn2, which, however, may also be dispensed with without the function described in FIG. 8 being impaired. The encryption circuit 1020 described in FIG. 10 therefore comprises, in addition to the encryption circuit 920 described in FIG. 9 already, a single-rail read-in circuit 212, described already in FIG. 3, as well as a dual-rail output circuit 214, also already described in FIG. 3. As was already described in FIG. 3, the single-rail read-in circuit 212 comprises a first control line for receiving a first control signal ENN. The encryption circuit 1020 additionally comprises a first control line E2 for providing a first control signal ENN2. As was already described in FIG. 3, the first control signal ENN controls a connecting-through of signal dn0 via transistors P3, N3. In this embodiment, signal dn0 represents a connection of encryption circuit 920 with the single-rail read-in circuit and transmits, as was described in FIG. 9, a value resulting from an XOR operation of logic signals lo, loq and key signals k', kn'. Since the logic signals lo, loq are preferably implemented in dual-rail technology with precharge states; the signal dn0 also has precharge states which are preferably filtered out in the encryption circuit 1020. For this purpose, the first control signal ENN is preferably controlled, via the first control line ENN2, such that signal dn0 is not connected through transistors P3, N3 during a precharge state. The signal dn1 read-in is converted into a first signal ds and a complementary first signal dsn in the dual-rail output circuit. In the embodiment described in FIG. 10, the first signal ds is output as an encrypted logic signal dc2 via the first data output line D2, and the complementary first signal dsn is output as a complementary logic signal dsn2 via the second data output line DN2.

Figure 11:
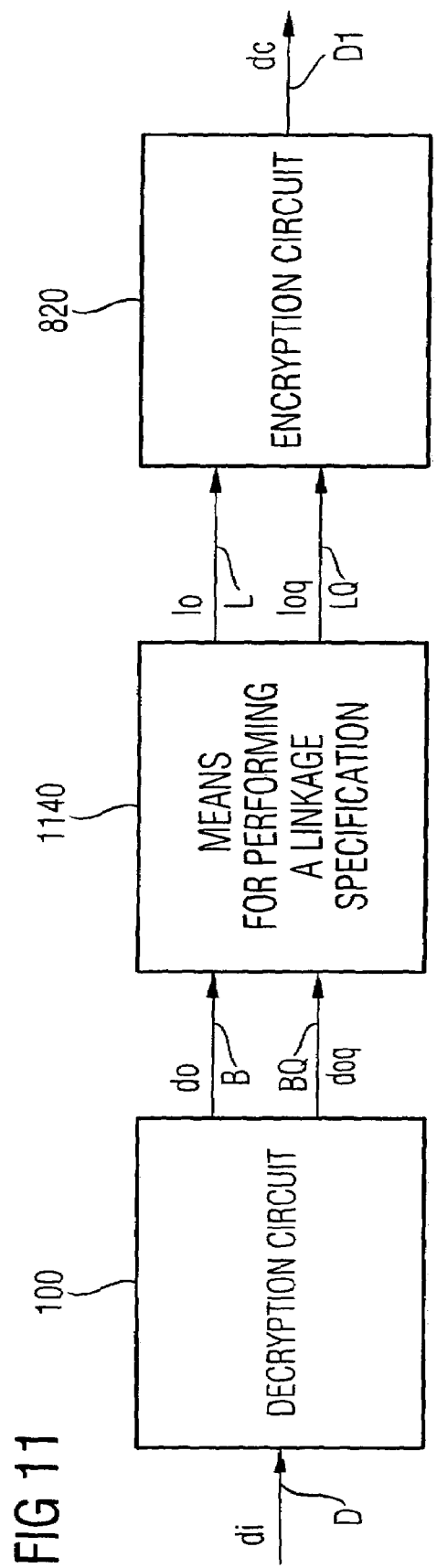
FIG. 11 is a block diagram of a logic cell in accordance with the present invention.

FIG. 11 shows a diagrammatic representation of a logic cell in accordance with the present invention. The logic cell comprises a decryption circuit 100, as was described with reference to FIG. 1, means 1140 for performing a linkage specification, as well as an encryption circuit 820, as has been described with reference to FIG. 8.

The decryption circuit 100 comprises a data input line D for receiving an encrypted data signal di and is connected, via a first data line B and a second data line BQ, to means 1140 for performing a linkage specification. Means 1140 for performing a linkage specification is connected to encryption circuit 820 via a first logic line L and a second logic line LQ. The encryption circuit 820 comprises a data output line D1 for outputting an encrypted logic signal dc.

As was described with reference to FIG. 1, the decryption circuit 100 is configured to provide a decrypted data signal do on the first data line B as well as a complementary decrypted data signal doq on the second data line BQ. Means 1140 for performing a linkage specification is configured to receive the data signal do, doq and to provide a logic signals lo on the first line as well as a complementary logic signal loq on the second logic line LQ.

Means 1140 for performing a linkage specification is configured to provide the logic signals lo, log from the decrypted data signals do, doq in accordance with the linkage specification.

In accordance with a preferred embodiment, the logic cell depicted in FIG. 11 enables a realization, implemented in dual-rail technology, of a linkage specification in a single-rail environment. The decryption circuit 100 here enables an input-side connection of the logic cell to a data input line D1 implemented in single-rail technology. On the output side, the encryption circuit 820 enables a connection of the logic cell to a data output line configured in single-rail technology. The encrypted data signal di as well as the encrypted logic signal dc are preferably transmitted in an encrypted form. Means 1140 for performing a linkage specification is preferably implemented in dual-rail technology.

Figure 12:
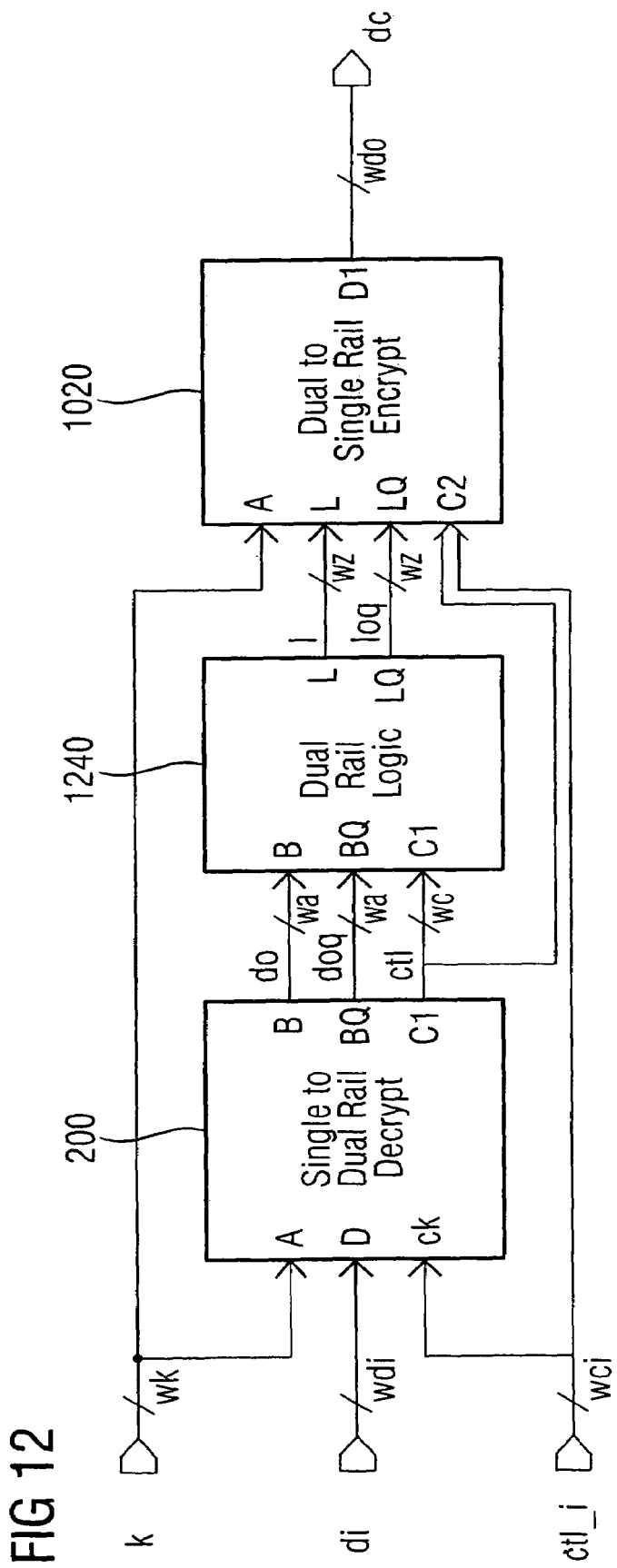
FIG. 12 is a block diagram of a logic cell in accordance with a preferred embodiment of the present invention.

FIG. 12 shows a preferred embodiment of an inventive logic cell in a diagrammatic representation. The logic cell comprises a decryption circuit 200, as has been described in FIG. 2, means 1240 for performing a linkage specification, as well as an encryption circuit 1020, as has been described in FIG. 10. As has already been described with reference to FIGS. 2 and 10, the decryption circuit 200 and the encryption circuit 1020 comprise a key line A for receiving a key signal k, as well as control signal inputs. In this embodiment, the key supplied to decryption circuit 200 is transmitted via the same line as the key supplied to the encryption circuit 1020. The decryption circuit 200 is therefore connected to key line A, on which key signal k is supplied, as is the encryption circuit 1020. For clarity's sake, no complementary key line is shown in this diagrammatic representation. Also for clarity's sake, the clock line shown in FIG. 2 as well as the reset line are shown as one line in the diagrammatic representation depicted in FIG. 12, the line supplying the decryption circuit 200 both with a clock signal and with a reset signal, in the form of an input control signal ctl_i, at a first control signal input ck. Also, the encryption circuit 1020 is supplied with the input control signal ctl_i via a second control signal input C2. In this embodiment, a first control signal ctl is generated in the decryption circuit 200, output via an additional control line C1 and received by means 1240 for performing a linkage specification, as well as by encryption circuit 1020. In addition to the first control signal described, additional control signals, diagrammatically depicted as control signal ctl, may be provided by decryption circuit 200.

In accordance with a further embodiment, the encryption circuit 1020 is provided only with the control signal ctl, generated by decryption circuit 200, or only with the input control signal ctl_i. Alternatively, encryption circuit 1020 is not provided with any control signals from outside. In this case, any control signals required are generated within encryption circuit 1020.

In a potential multi-bit realization of the logic cell shown in FIG. 12, the signals and the signal lines shown are implemented as signal busses and/or signal line busses of the bit widths wk, wdi, wci, wa, wc, wz, wdo.

Figure 13:
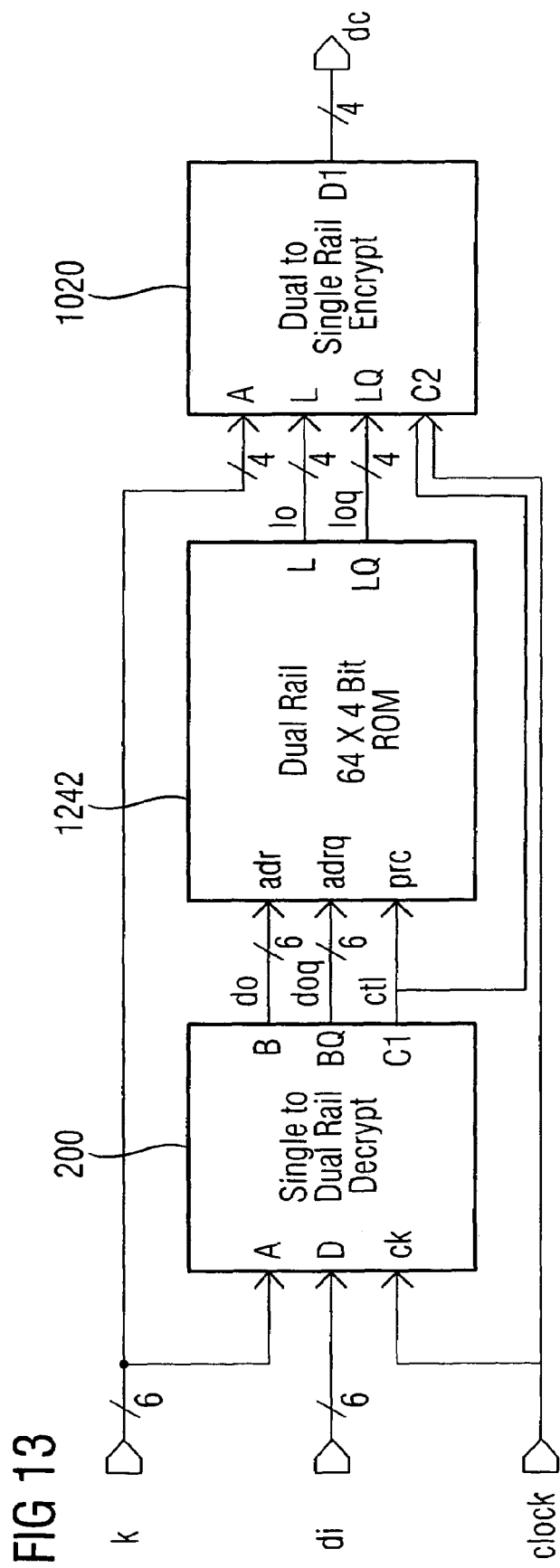
FIG. 13 is a block diagram of a logic cell in accordance with a further preferred embodiment of the present invention.

FIG. 13 shows a diagrammatic representation of a preferred embodiment of the inventive logic cell. In accordance with the embodiment shown in FIG. 12, the logic cell depicted in FIG. 13 comprises a decryption circuit 200, an encryption circuit 1020 and means 1242 for performing a linkage specification. In this embodiment, means 1242 for performing a linkage specification is a so-called S box of a DES (data encryption standard) algorithm, the box being implemented as a 64×4 bit ROM in dual-rail circuit technology in FIG. 13. In this embodiment, the key signal k as well as the encrypted data signal di each have a width of 6 bits. The encrypted data signal di corresponds to an XOR linkage of a data signal (not shown) with key signal k. What is shown as the control signal in this diagrammatic representation is only the clock signal, which is received, on the input side, by the decryption circuit 200 as well as by the encryption circuit 1020. The decrypted data signals do, dog, which are provided by the decryption circuit 200, also have widths of 6 bits and are received by means 1242 for performing a linkage specification on address lines adr, adrq. Likewise, means 1242 for performing a linkage specification receives a first control signal ctl, provided by the decryption circuit 200, at an additional control signal input prc. The data signals do, dqo decrypted in accordance with the DES algorithm are supplied, in this embodiment, to encryption circuit 1020 as logic signals lo, log of a width of 4 bits on the first logic line L and the second logic line LQ by means 1242 for performing a linkage specification. The encrypted logic signal dc provided by the encryption circuit 1020 corresponds to an XOR linkage of the logic signals lo, loq and key signal k. Since logic signals lo, loq each have a width of four bits, only four bits of logic signal k are supplied to encryption circuit 1020.

In accordance with a further embodiment, the encryption circuit 1020, in turn, is not provided with a control signal.

The transistor circuits and/or logic circuits depicted in the above-described embodiments are exemplary and may be implemented in a different manner while maintaining their functions. This applies particularly to those cases where the inventive circuits are realized in components which exhibit standard structures, such as XOR gates, which are already prepared.

Depending on the circumstances, the inventive circuits as well as the inventive logic cell may be implemented in hardware or in software. The implementation may be effected on a digital storage medium, in particular a disc or CD with electronically readable control signals, which may cooperate with a programmable computer system such that the corresponding method is performed. Generally speaking, the invention thus also consists in a computer program product with a program code, stored on a machine-readable carrier, for performing the inventive method when the computer program product runs on a computer. In other words, the invention may thus be realized as a computer program with a program code for performing the method when the computer program runs on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A logic cell, comprising:
 a decryption circuit, comprising:
   a single-rail technology interface configured to receive an encrypted data signal on a data input line;
   a generator configured to generate a decrypted data signal from the encrypted data signal and a key, and to generate a complementary decrypted data signal; and
   a dual-rail technology interface configured to output the decrypted data signal on a first data line, and the complementary decrypted data signal on a second data line;
 an encryption circuit, comprising:
   a dual-rail technology interface configured to receive a logic signal on a first logic line, and a complementary logic signal on a second logic line;
   a generator configured to generate an encrypted logic signal from the logic signal and/or from the complementary logic signal and from a key; and
   a single-rail technology interface configured to output the encrypted logic signal on a data output line; and
 a performer configured to perform a linkage specification, which is connected to the decryption circuit via the first data line and the second data line, and is connected to the encryption circuit via the first logic line and the second logic line,
 wherein the performer is implemented in dual-rail circuit technology and is configured to perform a linkage specification to generate the logic signal and the complementary logic signal in accordance with the linkage specification from the decrypted data signal and the complementary decrypted data signal.

2. The logic cell as claimed in claim 1, wherein the decryption circuit comprises an initialization clock inserter configured to insert a respective initialization state on the first data line and the second data line, between respective data signal states of the decrypted data signal and the complementary decrypted data signal.

3. The logic cell as claimed in claim 1, wherein the key is a serial random bit stream, and the generator configured to generate a decrypted data signal is a decryptor configured to serially decrypt the encrypted data signal.

4. The logic cell as claimed in claim 1, wherein the generator configured to generate a decrypted data signal is an exclusive OR circuit.

5. The logic cell as claimed in claim 1, wherein the generator configured to generate a decrypted data signal comprises a key line configured to receive the key.

6. The logic cell as claimed in claim 1, wherein the decryption circuit comprises a controller configured, in response to a control signal,
- to output a reception control signal for controlling a receipt of the encrypted data signal to the receiver;
- to output a precharge control signal for inserting an initialization state between respective data signal states into the decrypted data signal and the complementary decrypted data signal to the generator for generating a decrypted data signal; and
- to output a decryption control signal for controlling a decryption of the encrypted data signal to the generator for generating a decrypted data signal; and
- to output an output control signal for controlling output of an output signal and a complementary output signal to the outputter for outputting the decrypted data signal.

7. The logic cell as claimed in claim 1, wherein the encryption circuit is further configured to eliminate a respective initialization state on the first logic line and the second logic line between respective logic signal states of the logic signal and the complementary logic signal.

8. The logic cell as claimed in claim 1, wherein the logic cell is configured to receive a control signal.

9. The logic cell as claimed in claim 1, wherein the performer configured to perform a linkage specification is a read-only-memory, and wherein the linkage specification is a substitution mapping.

10. The logic cell as claimed in claim 9, wherein the read-only-memory comprises an S box of a cryptographic algorithm.

11. The logic cell as claimed in claim 1, which is a semi-customized standard cell of an integrated circuit.

12. The logic cell as claimed in claim 1, wherein the logic cell is implemented in transistor technology.

13. A method of performing a dual-rail logic operation in a single-rail logic environment, comprising:
   a) receiving, at a single-rail technology interface, an encrypted data signal;
   b) generating a decrypted data signal and a complementary decrypted data signal from the encrypted data signal and a key, and outputting the decrypted data signal and the complementary decrypted data signal from a dual-rail technology interface;
   c) generating, by a dual-rail technology circuit, a logic signal and a complementary logic signal in accordance with a linkage specification from the decrypted data signal and the complementary decrypted data signal, and outputting the logic signal and the complementary logic signal from a dual-rail technology interface;
   d) receiving, at a dual-rail technology interface, the logic signal and the complementary logic signal, and generating an encrypted logic signal from the logic signal and the key; and
   e) outputting, from a single-rail technology interface, the encrypted logic signal.

14. A computer readable medium having a computer program with a program code for performing the method of claim 13,
   when the computer program runs on a computer.

* * * * *